United States Patent [19]
Coe

[11] Patent Number: 4,939,390
[45] Date of Patent: Jul. 3, 1990

[54] CURRENT-STEERING FET LOGIC CIRCUIT

[75] Inventor: Timothy Coe, Oxnard, Calif.

[73] Assignee: Vitesse Semiconductor Corporation, Camarillo, Calif.

[21] Appl. No.: 294,271

[22] Filed: Jan. 6, 1989

[51] Int. Cl.⁵ .................. H03K 19/003; H03K 19/01; H03K 19/094; H03K 3/356

[52] U.S. Cl. ................... 307/450; 307/279; 307/443; 307/359; 307/571; 307/544

[58] Field of Search ............... 307/448, 450, 455, 443, 307/359, 574, 571, 581, 575, 577, 554, 544, 542

[56] References Cited

U.S. PATENT DOCUMENTS

| | | | |
|---|---|---|---|
| 4,661,725 | 4/1987 | Chantepie | 307/450 |
| 4,800,303 | 1/1989 | Graham et al. | 307/450 |
| 4,808,851 | 2/1989 | Chantepie | 307/450 |
| 4,831,284 | 5/1989 | Anderson et al. | 307/450 |

*Primary Examiner*—Stanley D. Miller
*Assistant Examiner*—David R. Bertelson
*Attorney, Agent, or Firm*—David W. Collins

[57] ABSTRACT

An integrated circuit, having applicability to GaAs circuitry, is disclosed for performing a current steering logic function. The integrated circuit comprises a switching circuit, a high impedance tail current source, and a pair of low impedances respectfully coupled to the tail current source through a respective one of the switching transistors. The resistors in the tail current source and in the load resistance are formed from sheet resistor material so that any process-induced variation in the resistivity of the sheet material causes a mutual but compensatory variation in both the load and current source resistors, maintaining a match between the current capability of the current source and the resistance of the loads. The follower circuit, on the other hand, comprises a low impedance FET and a follower current source having an active load whose current is primarily dependent on its threshold voltage. Accordingly, process factors which affect the threshold voltage of the low impedance FET also affect the threshold voltage of the active load in a mutually compensatory manner without adversely affecting the output levels of the logic level signals from the current steering circuit.

13 Claims, 2 Drawing Sheets

CURRENT-STEERING FET LOGIC CIRCUIT

This invention relates to an improved integrated current-steering logic circuit susceptible to fabrication from Group III–V materials.

Gallium arsenide devices (GaAs) are one type of Group III–V devices which have recently been developed as a preferable alternative to silicon based devices in the building of digital logic gates, where faster switching times and lower dc power dissipation are desirable. First generation logic gates built with GaAs FETs, for example, have exhibited switching times as low as 80 psec with 1–2.5 mW power dissipation. While GaAs will accordingly be discussed for the purpose of clarity, it should be recognized that the invention herein is applicable to any FET-based logic-steering circuit which is susceptible to the process limitations and variations discussed below, including circuits formed from silicon or other Group materials, Group III–V materials such as GaAS, or other materials which have those limitations and variations.

GaAs FET's are generally similar to silicon MOSFETs in structure. However, while the gate of a silicon MOSFET is insulated from the rest of the device by a dielectric layer, a suitable dielectric does not exist for GaAs; accordingly, the gate region of a GaAs FET typically forms a Schottky barrier diode. Consequently, the maximum gate-to-source voltage ($V_{gs}$) of the GaAs FET is approximately 0.8 volts.

This invention is directed to the implementation of GaAs technology in connection with current steering circuits. Generally, current-steering circuits are a type of logic circuit known to have switching times which are among the fastest. A typical current-steering logic circuit is shown in FIG. 1 as comprising a switching circuit 10 and a pair of follower circuits 22, 24. The current-steering circuit 10 has a pair of input terminals 11a, 11b, and a pair of output terminals 13a, 13b. An input logic-level signal applied to a selected one of the inputs 11a, 11b causes the output terminals 13a, 13b to assume a representative output state.

The switching circuit 10 comprises a pair of FETs 12, 14 whose sources "s" are coupled to a common current source 16. The current source 16, referred to as the "tail" source, includes an impedance 16a. The drains "d" of FETs 12, 14 are coupled through respective loads 17, 18 to ground. The gates "g" of the FETs 12,14 serve as the inputs to the switching network 10.

When a high logic level signal is applied to the gate of a selected one of the FETs 12, 14, current flows from ground, through the load associated with that FET, through the drain and source of the selected FET, and into the tail current source 16. Consequently, the node 20, 21 between the selected FET and its load transits to a "lo" logic level, while the node 21, 20 between the non-selected FET and its load remains at a "hi" logic level. The term "current-steering" is accordingly used to connote the fact that current from the positive voltage source V+ is "steered" through one load or the other, into the current source.

The follower circuits 22,24 are respectively coupled to the nodes 20, 21 to provide a low impedance output signal from the current steering circuit. In addition, the follower circuits are level-shifting circuits which provide output signals of standardized voltage levels from the current steering circuit. As is known in the art, each of the follower circuits is essentially a current amplifier of the type frequently used in emitter-coupled logic circuitry to ensure that proper voltage levels are maintained at the output of a logic device. Owing to its low output impedance, the follower circuit can provide relatively large drive currents to the next stage of circuitry. This is particularly important where fast switching times are required, and parasitic capacitances must be quickly charged before an output-state transition can take place.

As shown in FIG. 1, the follower circuits 22, 24 respectively include an FET 26, 28 having its respective gate "g" coupled to the respective node 20, 21 of the switching circuits 10, 12. The drain "d" of the FET 26 is coupled to the positive voltage source V+, and the source "s" is coupled to a follower current source 30 through a diode 32, with the diode's cathode being coupled to the current source, and the diode's anode coupled to the FET. The node 34 between the diode 32 and follower current source 30 serves as one output for the current-steering circuit.

The FET 28 of follower circuit 24 is similarly coupled between the positive voltage source V+ and its own follower current source 36 via a diode 38, so that the node 40 between the diode 38 and current source 36 serves as the other output from the current-steering circuit.

The tail current source 16 must be matched to the current requirements dictated by the load elements 17, 18 and the current bias conditions. If the current source 16 is too large, then the voltage at its node 16a is pulled closer to the negative supply voltage −V, causing the circuit to malfunction. Specifically, leakage conduction occurs in the OFF FET 12, 14 which degrades the hi logic level at the respective node 20, 21. Consequently, diode elements and the like, are typically utilized to block such currents, resulting in less available space on the semiconductor chip for active components and logic functions. Further, the power dissipation associated with those diode elements is just wasted power, since the power is not expended to perform any logic function.

If, on the other hand, the capability of the tail current source is inadequate to absorb all of the current flowing through the selected load, the level of the lo logic-level signal at the output nodes 20, 21 of the switching circuit is degraded. Consequently, the value of the low level signal approaches the value of the high level with reduced noise margin and other attendant complications well known in the art.

The same principal is true for the follower circuitry. The current source in each of the follower circuits must be matched to the follower transistors 26, 28 in the respective follower circuit. Mismatches in the follower current source with respect to the follower transistor's current capability results in a variation in the resulting output logic levels.

The actual signal level at the nodes 20, 21 also varies from the desired nominal level with variations in either the load resistance 17, 18 or the resistance associated with the tail current source 16. In essence the current source resistance forms a voltage divider network with the load resistance associated with the selected FET. Accordingly, an increase in load resistance results in a decrease in the signal level at the nodes 20, 21 while an increase in the resistance of the tail source has the opposite effect.

The consequences of non-nominal resistance values is twofold. First, the voltage level of the output signal from the current steering circuit is affected. In extreme cases, it may not be possible for the current-steering circuit to communicate with the next stage of circuitry. Second, the non-nominal values of current which flow, owing to the non-nominal values of resistance, create a mismatch between the current sources and the circuits which they supply. The mismatches have the previously described consequences attributed to mismatched sources.

A significant obstacle to the use of gallium arsenide technology for these types of circuits in particular is unavoidable random and uncontrollable process-induced variances in component performance, that create a mismatch in nominally matched components. One of these variances is the variation in the threshold voltage of GaAs FETs which, as explained below, affects not only their performance as switching components and current amplifiers, but also their performance as active loads; i.e., normally ON FETS which act as resistance elements.

These process-related obstacles are not present in bipolar silicon-based technology, where the loads are typically resistors formed from a sheet resistance material, while the active components are typically NPN bipolar transistors which are normally in an OFF state.

While the resistance that governs the voltage-dependent current through sheet resistance material is simply a function of the resistivity of the material, the current-to-voltage relationship of an active load is primarily a function of its threshold voltage; i.e., the voltage which must be applied between its gate and source before its conducts. Since the gate-to-source voltage ($V_{gs}$) of a depletion mode FET with its gate coupled to its source is zero, and therefore greater than its threshold voltage ($V_{th}$), the FET conducts current from its drain to its source approximately in accordance with the equation:

$$I = k(V_{gs} - V_{th})^2. \quad (1)$$

Because $V_{gs} = 0$, any variation in the threshold voltage of an active load effects the current through the FET by a power of 2. Consequently, the "resistance" of the active load is highly sensitive to its threshold voltage, and any current source or voltage source which utilizes an active load is said to be "threshold-based". By contrast, sources which depend upon sheet-resistance material are referred to as "resistor-based".

Typically, the threshold voltage for depletion mode FETs is nominally $-0.8$ volts, while that of an enhancement mode FET is nominally $+0.25$ volts. In practice, the actual threshold voltage varies considerably owing to process and temperature variations which are difficult to hold constant. These process variations occur somewhat randomly, and are independent of the also-random process-induced variations in sheet resistivity. Consequently, the use of a preferred circuit element for a particular purpose will frequently introduce unexpected and unpredictable malfunctioning of the overall circuit.

One particularly troublesome effect of variances in actual threshold voltage is a phenomenon known as "backgating", whereby voltages applied to neighboring components which share a substrate with an FET will create electric fields in the substrate material which influence carrier flow within the channel of the FET. By effectively changing the threshold voltage of that FET to a value which is different from that of physically identical neighboring FETs, these parasitic electric fields can "lock up" a switching FET and/or change the effective resistance of an active load. Because the occurrence of the backgating is layout, temperature, and substrate dependent, and can also depend on the state of the neighboring components, backgating is difficult to predict, and difficult to prevent or control.

In the past, the accepted manner for controlling the incidence of backgating has been to maintain a sufficient distance between FETs which share the substrate. This, of course, has reduced the allowable density of components on the substrate and has added to the parasitic capacitances of the circuitry by requiring longer leads to and from those components.

SUMMARY OF THE INVENTION

A fast, reliable, mass producable, and compact current-steering circuit is disclosed herein which can be fabricated from Group III–V materials and which is capable of quickly charging the parasitic capacitances which would otherwise limit its response time to input changes. The subject current-steering circuit comprises a switching circuit and a follower circuit. The switching circuit includes a pair of switching FETs, a high impedance tail current source and a pair of load impedances respectively coupled from common to the tail current source through a respective one of the switching FETs.

The resistors in the tail current source, as well as the load resistance, are formed from sheet resistor material so that any process-induced variation in the resistivity of the sheet material causes a mutual but compensatory variation in both the load and the current source resistors, maintaining a match between the current capability of the current source and the resistance of the loads.

The follower circuit includes a follower current source coupled to ground through the drain and source of a low impedance FET. The gate of the low impedance FET is coupled to the output of the switching circuit portion, with the output of the current-steering circuit being taken between the low impedance FET and the follower current source. The follower current source comprises an active load in the form of a semiconductor device whose current is primarily dependent on its threshold voltage. Accordingly, process factors which effect the threshold voltage of the low impedance FET also effect the threshold voltage of the active load in a mutually compensatory manner without adversely effecting the output levels of the logic level signals from the current steering circuit.

These and additional matters pertaining to the invention are described in greater detail below in the Description of the Preferred Embodiment, of which the Drawing forms a part.

DESCRIPTION OF THE PREFERRED EMBODIMENT

Figure 1:
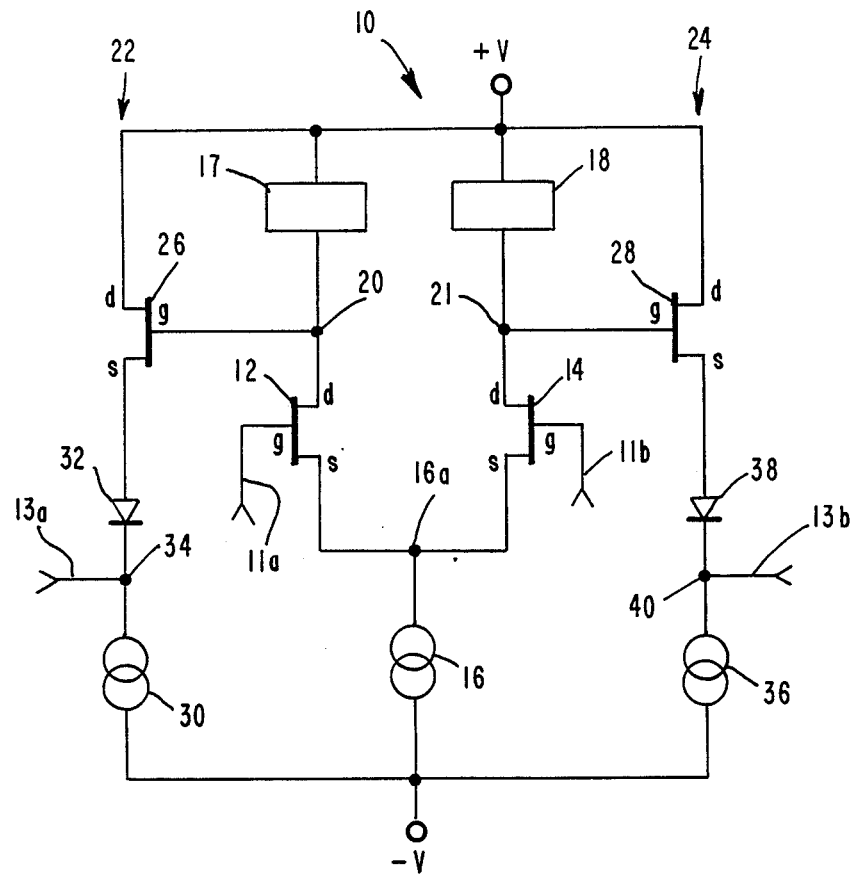
FIG. 1 is a schematic diagram of a current steering circuit.
Figure 2:
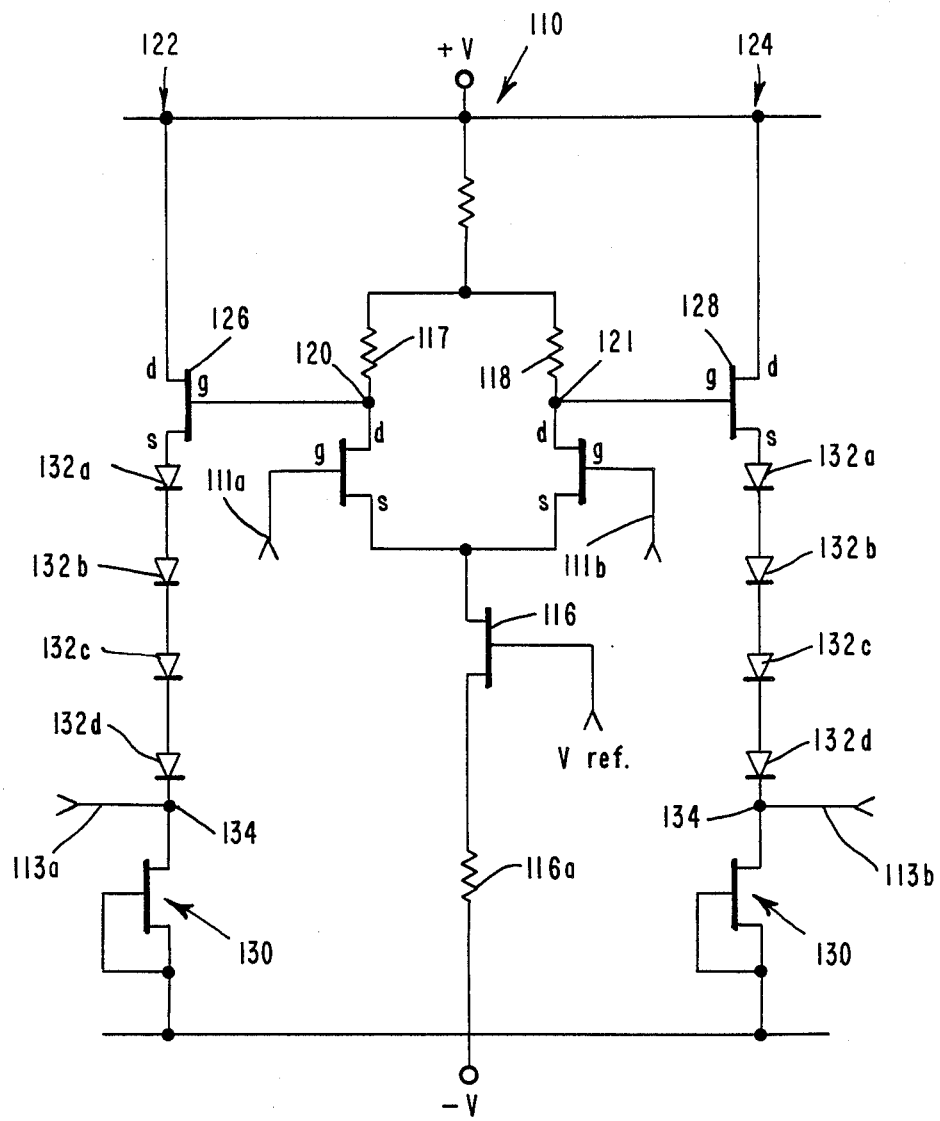
FIG. 2 is a schematic diagram of a current steering circuit constructed in accordance with the invention.

FIG. 2 is a schematic illustration of a current-steering circuit fabricated with GaAs technology on a semiconductive substrate in accordance with the invention. As in the circuit of FIG. 1, the illustrated circuit comprises a switching circuit 110 and a pair of follower circuits 122, 124. The switching circuit 110 is characterized by a pair of input terminals 111a, 111b, and a pair of output terminals 113a, 113b. An input logic-level signal applied to a selected one of the inputs 111a, 111b causes the output terminals 13a, 13b to assume a representative output state.

The switching circuit 110 comprises a pair of depletion mode FETs 112, 114 whose sources "s" are coupled to a common current source comprising an enhancement-mode GaAs FET 116 and sheet resistance 116a formed from n+ implanted GaAs as known in the art. The drains "d" of FETs 112, 114 are coupled through loads 117, 118 to the positive voltage source +V. The loads 117, 118 are also formed from sheet resistance material, and have an electrical resistance of 1100 ohms. The gates "g" of the FETs 112, 114 serve as the inputs to the switching network 110.

When a high logic level signal is applied to the gate of a selected one of the FETs 112, 114, current flows from the positive voltage source +V, through the load 117, 118 associated with that FET, through the drain and source of the selected FET, and into the common current source formed by the FET 116 and resistor 116a. The node 120, 121 between the selected FET and its load 117, 118 transits to a "lo" logic level, while the node 121, 120 between the non-selected FET and its load remains at a "hi" logic level. The current source current is inversely determined by the current source resistor 116a. Typically, voltages of −0.5 volts and −1.6 volts are used for "hi" and "lo" logic level signals, respectively.

The actual value of the "lo" level logic signal is effected by the relative values of the load resistance and current source current. For example, the "lo" level logic signal at output terminal 113a decreases if the load resistor 117 is higher than its nominal value and/or the current source current is greater than its nominal value. Conversely, the "lo" signal value rises with decreases in the value of the load resistance and/or decreases in the current source current. By fabricating the load resistors 117, 118 and current source resistor 116a from the same sheet resistance material, and by locating these components close together on the substrate, any process variables or thermal effects which effect one of the resistors effects the others in a similar and compensatory manner. Thus, an increase in the load resistance from nominal will be accompanied by an increase in the current source control resistance 116a, thereby tending to keep the voltage at node 120 at a substantially constant level.

The follower circuits 122, 124 of the illustrated circuit respectively include a pair of depletion-mode GaAs FETs 126, 128 having their respective gates "g" coupled to respective nodes 120, 121 of the switching circuits 110, 112. The drains "d" of the FETs 126, 128 are coupled to the positive voltage source +V, while their sources "s" are coupled to a respective series of diodes 132 a–d and a respective depletion-mode based current source 130. A pair of nodes 134 are respectively defined between the diode 132d and depletion-mode current source 130 of each follower circuit. The nodes 134 serves as the output terminals for the current-steering circuit.

The diodes 132a–d are conveniently formed from the gate-to-source Schottky junctions of FETs formed on the substrate and accordingly impose voltage drops of 0.65v each in the circuit. The nominal output levels at terminals 113a, 113b can accordingly be selected by choosing an appropriate number of diodes to drop the output level to the desired value.

Since the voltage-current relationships of both the depletion mode follower FETs 126, 128 and their respective current sources 130 are primarily dependent on their threshold voltage values, process-related variances that effect the threshold voltage of one of them will effect the threshold voltage values of the other FETs in a similar and compensating manner.

The circuit thus described employs a number of highly desirable features which enable GaAs technology to be utilized in a commercially producable current-steering circuit having maximum switching speed capability. First, an enhancement-mode FET is used in the current source. This is desirable because of its low output conductance and higher threshold voltage. The first characteristic is true of all good current sources, and causes the source to produce a current which is essentially independent of load variations in the circuitry fed by the source. In the disclosed embodiment, the conductance of the current source is approximately 20 micro-siemens (micro-mhos).

The higher nominal threshold voltage of the E-mode FET is preferable because it essentially makes the source's current independent of the variances in threshold voltages from FET to FET, which occur as a result of variables in the manufacturing process. The nominal threshold voltage of an enhancement mode FET is approximately +0.25 volts, while that of a depletion mode FET is typically −0.8 volts. Since the threshold voltage of an FET may vary by as much as 100 millivolts from the nominal value because of random variables, and since the current through an FET is related to the threshold voltage as set forth in equation 1, above, the variation in the nominally larger threshold voltage will have a comparatively smaller effect on the value of current flowing through the FET for a particular gate-to-source voltage.

Another advantage of the illustrated circuit is that it uses depletion-mode GaAs FETs as the follower FETs. First, depletion mode FETs are physically smaller than enhancement-mode FETs, resulting in less parasitic capacitance. Although the greater parasitic capacitances associated with the larger enhancement-mode FETs are allowable in applications such as the current source FET 116 where rapid switching is not performed, parasitic capacitances must be minimized where switching speeds are to be maximized.

In addition to possessing minimal parasitic capacitance, depletion-mode FETs produce more output current for a given gate-to-source voltage than enhancement mode FETs, thereby charging any parasitic capacitances more quickly so that switching speeds are improved. As shown by Equation 1, the depletion mode FET produces more current for a given gate-to-source voltage because it has a lower threshold voltage than an enhancement mode FET. In examining Equation 1, it may be remembered that the maximum of the gate-to-source voltage of a GaAs FET is nominally 0.6 volts, owing to the Schottky diode inherent on the FET's structure. Thus, the maximum output current for a D-mode FET will be $k(0.6v - 0.8v)^2 = k \times 1.4^2 = 1.96k$ ma., compared with $k(0.6-0.25)^2 = 0.1225k$ ma. for an E-mode FET.

Generally, both the enhancement mode and depletion mode FETs illustrated in FIG. 2 have a channel length of approximately 1.2 um. The width of the channels for the depletion mode FETs is approximately 28000/R mm, where R is the electrical resistance of the loads 117, 118.

The illustrated circuit is accordingly capable of driving any of a variety of loads which are coupled to it, and able to quickly charge the parasitic capacitances associated with the output load. The current-to-voltages relationships of the current source and load in the switching circuit are resistor-based so that a process-induced variance from nominal in one of the two causes a inherently compensating variance in the other.

Similarly, the current-to-voltages relationships of the follower current source and low impedance follower FET are both $V_{th}$-based so that a process-induced variance from nominal in one of the two components causes a inherently compensating variance in the other. In summary, the illustrated circuit provides little variation in output levels as the manufacturing process incurs random variations. Consequently, the yield rate of the process is enhanced as the number of circuits passing quality control testing is increased.

While the foregoing description includes details which will enable those skilled in the art to practice the invention, it should be recognized that the description is illustrative in nature and that many modifications and variations will be apparent to those skilled in the art having the benefit of these teachings. It is accordingly intended that the invention herein be defined solely by the claims appended hereto and that the claims be interpreted as broadly as permitted in light of the prior art.

I claim:

1. An integrated circuit for performing a current steering logic function comprising:
   first and second transistor means, each having respective pairs of main terminal means and a respective gating means for selectively electrically coupling the main terminal means of the respective transistor means;
   first and second load resistors formed from respective segments of sheet resistance material, each of the first and second load resistors being coupled to a respective one of the main terminal means of a respective one of the first and second transistor means;
   first high impedance current source means coupled to the other of the main terminal means of the first and second transistor means for selective coupling to the load resistances via a selected one of the first and second transistor means in response to an input signal at the gating means thereof, the impedance of said current source means being primarily derived from the same sheet resistance material as that of the load resistors; and
   third and fourth field effect transistor means, each having respective pairs of main terminal means and respective gating means for selectively electrically coupling the main terminal means of the respective transistor means,
   the gating means of the third and fourth transistor means being coupled to different ones of the load resistances so as to render the third and fourth transistor means responsive to the coupling the load resistances to the current source;
   high impedance follower current source means coupled to said third and fourth transistor means and including a semiconductor device of the threshold voltage type, the impedance of the follower current source being primarily dependent on the threshold voltage of the semiconductor device so that process-induced variations in the threshold voltage of the third and fourth transistor means and of the semiconductor device are mutually compensatory.

2. The integrated circuit of claim 1 wherein the integrated circuit is formed from a Group III-V material.

3. The integrated circuit of claim 2 wherein the Group III-V material is gallium arsenide.

4. The integrated circuit of claim 1 wherein the first and second transistor means are depletion mode transistors.

5. The integrated circuit of claim 1 wherein the first high impedance current source includes an enhancement-mode field effect transistor formed from a Group III-material.

6. The integrated circuit of claim 5 wherein the Group III-V material is gallium arsenide.

7. The integrated circuit of claim 6 wherein the first high impedance current source includes a segment of sheet resistance material coupled in electrical series with the enhancement mode field effect transistor.

8. The integrated circuit of claim 1 wherein the third and fourth transistor means are fabricated from gallium arsenide.

9. The integrated circuit of claim 1 wherein the third and fourth transistor means are depletion mode field effect transistors.

10. The integrated circuit of claim 1 wherein the follower current source means includes a field effect transistor fabricated from a Group III-V material and having a pair of main terminal means and gating terminal means, the gating means being coupled to one of the main terminal means so that the pair of main terminal means are electrically coupled to each other.

11. An integrated circuit comprising:
   first Group III-V field effect transistor means;
   a load resistance formed from a sheet resistance material;
   a high impedance current source selectively coupled to the load resistance by the first transistor means, the impedance of said current source being primarily derived from the same sheet resistance material as that of the load resistance; and
   a low impedance follower including
   second field effect transistor means fabricated from Group III-V material, and
   a high impedance follower current source coupled to said second transistor means and including a Group III-V semiconductor device of the threshold voltage type, the impedance of the follower current source being primarily dependent on the threshold voltage of the Group III-V semiconductor device so that process-induced variations in the threshold voltage of the second transistor means and of the semiconductor device are mutually compensatory.

12. An integrated current-steering circuit of the type having
   a switching circuit portion including first transistor means for directing current from a first high impedance current source through a selected one of a number of load resistances, and a follower circuit portion having second transistor means of the threshold voltage type for producing a low impedance output signal indicative of the selected load resistance, the follower circuit portion also including high impedance follower current source means, the improvement comprising:

the first transistor means being fabricated from a Group III-V material, the load resistances and the impedance of the high impedance current source being formed at least primarily from sheet resistance material, and the impedance of the follower current source being at least primarily established by transistor means of the threshold voltage type.

13. The integrated circuit of claim 2 wherein the first and second transistor means are depletion mode field effect transistors.

* * * * *